United States Patent
Tandou et al.

(10) Patent No.: US 8,426,764 B2
(45) Date of Patent: Apr. 23, 2013

(54) PLASMA PROCESSING APPARATUS AND PLASMA PROCESSING METHOD

(75) Inventors: Takumi Tandou, Asaka (JP); Kenetsu Yokogawa, Tsurugashima (JP); Masaru Izawa, Hino (JP)

(73) Assignee: Hitachi High-Technologies Corporation, Tokyo (JP)

(*) Notice: Subject to any disclaimer, the term of this patent is extended or adjusted under 35 U.S.C. 154(b) by 1253 days.

(21) Appl. No.: 12/193,117

(22) Filed: Aug. 18, 2008

(65) Prior Publication Data

US 2009/0277883 A1    Nov. 12, 2009

(30) Foreign Application Priority Data

May 9, 2008  (JP) .................................. 2008-123429

(51) Int. Cl.
*H01T 23/00* (2006.01)
*C23C 16/00* (2006.01)

(52) U.S. Cl.
USPC ................. 219/121.49; 118/724; 156/345.53; 361/234

(58) Field of Classification Search ............. 219/121.49; 118/500, 724, 725, 728; 361/234; 156/345.27; 204/192.32, 192.35

See application file for complete search history.

(56) References Cited

U.S. PATENT DOCUMENTS

| 2005/0045104 A1* | 3/2005 | Arai et al. ..................... 118/724 |
| 2007/0081295 A1 | 4/2007 | Brillhart et al. |
| 2008/0023147 A1 | 1/2008 | Yokogawa et al. |

FOREIGN PATENT DOCUMENTS

| JP | 2005-089864 | 4/2005 |
| JP | 2008-034408 | 2/2008 |

* cited by examiner

*Primary Examiner* — Tu B Hoang
*Assistant Examiner* — Brian Jennison
(74) *Attorney, Agent, or Firm* — Antonelli, Terry, Stout & Kraus, LLP.

(57) ABSTRACT

The present invention provides means for controlling the temperature of a semiconductor wafer rapidly and uniformly in plane during etching processing by a large quantity of input heat by use of a refrigerating system by the heat of evaporation. A ring-shaped refrigerant passage is formed in a sample stand. Since the heat transfer rate and pressure loss of a refrigerant increase from a refrigerant supply port to a refrigerant ejection port as dryness degrees increase, these must be restricted. Therefore, constructionally, a supply refrigerant quantity is controlled to prevent the refrigerant from completely evaporating within the refrigerant passage, and the sectional areas of the refrigerant passage increase successively from a first passage to a third passage.

9 Claims, 14 Drawing Sheets

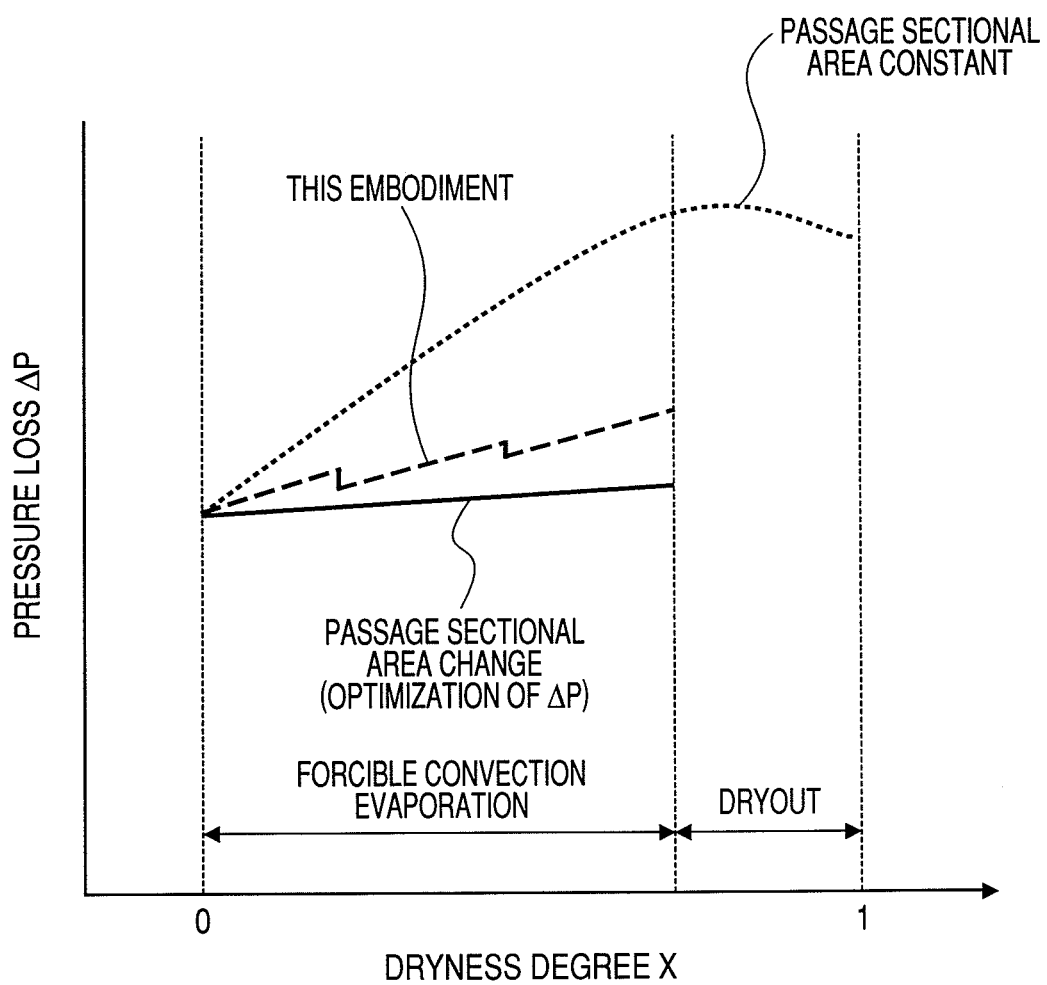

2-3 WALL SURFACE    2-2 WALL SURFACE    2-1 WALL SURFACE

PLASMA PROCESSING APPARATUS AND PLASMA PROCESSING METHOD

CLAIM OF PRIORITY

The invention claims priority from Japanese patent application JP 2008-123429 filed on May 9, 2008, the content of which is hereby incorporated by reference into this application.

FIELD OF THE INVENTION

The present invention relates to a plasma processing apparatus and a plasma processing method that perform microfabrication for a sample such as a wafer in a semiconductor manufacturing process, and more particularly to a temperature control unit and a temperature control method of an electrode part that holds and fixes a semiconductor wafer.

BACKGROUND OF THE INVENTION

As the downsizing of a semiconductor device progresses, machining accuracy demanded to etching processing for a sample is becoming stricter. To perform highly accurate machining for a microscopic pattern on a wafer surface in a plasma processing apparatus, temperature management of the wafer surface during etching is important. However, because of demand for a larger size of wafer and an increase in etching rates, high frequency electric power applied to the plasma processing apparatus tend to increase, and particularly in etching of insulating films, large electric power of kilowatt order is begun to be applied. Impact energy of ions to the wafer surface as a result of application of large electric power increases, and an excessive temperature rise of the wafer during etching is becoming a problem. Because of demand for a higher level of shape accuracy, means for enabling fast and accurate control of wafer temperatures during process is demanded.

To control wafer surface temperatures within the plasma processing apparatus, the surface temperatures of an electrode with electrostatic chuck (hereinafter referred to as an electrode) contacting with the back surface of the wafer via a heat conduction medium need to be controlled. Conventional electrodes have controlled the surface temperatures of the electrodes by internally forming a passage of a refrigerant and passing a liquid refrigerant through the passage. The liquid refrigerant is supplied to the electrode passage after being adjusted to a target temperature by a cooling apparatus or a heating apparatus within a refrigerant supply apparatus. Since such a refrigerant supply apparatus temporarily pools the liquid refrigerant in a tank and sends out it after adjusting temperatures, and the heat capacity of the liquid refrigerant itself is large, this construction is effective to keep the surface temperature of the wafer constant. However, even if it uses such refrigerant supply apparatus, temperature response in the electrode is bad, fast temperature control is difficult, and heat exchange efficiency is low. Therefore, the apparatus has been enlarged in size accompanying a large quantity of input heat in recent years, and it has been difficult to control the temperatures of wafer surface to be optimum as required etching progresses.

Because of these facts, an apparatus that increases in-plane temperature uniformity of an electrode by adopting a refrigerant supply apparatus of direct expansion system (hereinafter referred to as a refrigerating cycle of direct expansion system) that provides an electrode with a compressor by which a refrigerant circulation system increases the pressure of a refrigerant, a condenser that condenses the pressurized refrigerant, and an expansion valve that expands the refrigerant, and evaporates the refrigerant within a refrigerant passage of the electrode for refrigeration is proposed in JP-A No. 089864/2005, and US 0081295A1/2007. In the refrigerating cycle of direct expansion system, since evaporation latent heat of a refrigerant is used, cooling effects are high, and evaporation temperatures of the refrigerant can be fast controlled by pressure. From the above, by adopting the direction expansion system as a refrigerant supply apparatus to the electrode, temperatures of semiconductor wafer during etching by a large quantity of input heat can be controlled highly efficiently and fast.

In the above JP-A No. 084/2008, a method for uniforming in-plane temperatures of a sample to be processed by providing a space to which a refrigerant is supplied, and a space in which the refrigerant evaporates, and successively enlarging the passage sectional area of the refrigerant space.

In conventional refrigerating cycles of direct expansion system proposed in the above mentioned JP-A No. 089864/2005, and US 0081295A1/2007, latent heat when a refrigerant evaporates from liquid to vapor is used for cooling, and the evaporation temperatures of the refrigerant can be controlled by pressure. If the pressure of the refrigerant is constant within the refrigerant passage of the electrode, evaporation temperature is also constant.

However, since the refrigerant flows through the passage while absorbing heat and evaporating, heat transfer rate change as phases change. Specifically, even when refrigerant pressure is kept constant within the refrigerant passage with in-plane temperature uniformity of the electrode in mind, heat transfer rate become uneven, and it is difficult to control the surface temperature of the electrode and wafer temperature to be uniform within plane. Furthermore, actually, refrigerant pressure also changes within the passage due to pressure loss of the refrigerant. Pressure loss per unit length (hereinafter referred to as pressure loss) that occurs within the passage changes with phase change of the refrigerant. Therefore, adopting a refrigerating cycles of direct expansion system as a refrigerating mechanism of an electrode poses a technical problem of temperature distribution uniformity control within a plane.

The above JP-A No. 089864/2005 does not take a change in heat transfer rate accompanying such a phase change into account. The above US 0081295A1/2007 discloses technology that disposes an accumulator between a refrigerant ejection port of an electrode and a compressor and connects a bypass loop to a refrigerant supply port and the refrigerant ejection port to uniform in-plane temperature distributions of the electrode. The technology of the above US 0081295A1/2007 keeps the inside of a refrigerant passage of the electrode in a vapor-liquid mixed state and uniforms temperature distributions by controlling the opening of an expansion valve and a bypass flow rate for the expansion valve. As an example, liquid to vapor in the refrigerant supply port of the electrode is controlled to 40 to 60%, and liquid to vapor in the refrigerant ejection port is controlled to 10%. However, also in the above US 0081295A1/2007, a change in heat transfer rate accompanying phase change within the refrigerant passage of the electrode is not taken into consideration.

Also in JP-A No. 34408/2008, a change in heat transfer rate accompanying phase change is not taken into consideration. A refrigerant passage within a sample stand proposed in JP-A No. 34408/2008 has a problem that a passage connecting a refrigerant supply space and a refrigerant evaporation space has a contraction structure, and since pressure after contraction decreases, a pressure setting range of the refrigerant evaporation space is limited to a low pressure and the temperature setting range of a sample to be processed becomes narrow.

The inventors, as means for solving the above-described problem, previously proposed a method for changing the sectional area of a passage according to a dryness degree of a refrigerant from the entrance to the exit of a refrigerant passage, based on a property affording the relationship between dryness degrees of the refrigerant and heat transfer rate so that heat transfer rate of the refrigerant in the refrigerant passage within an electrode become uniform within a plane (Japanese Patent Application No. 016881/2007, filed on Jan. 26, 2007, and corresponding U.S. patent application Ser. No. 11/676, 593, filed on Feb. 20, 2007, hereinafter referred to as a prior filed invention). Specifically, according to the prior filed invention, in general properties of constant passage sectional areas, in places where the heat transfer rate of a refrigerant is large, the heat transfer rate of the refrigerant is reduced by enlarging a passage sectional area to decrease the flow rate of the refrigerant. Conversely, in places where the heat transfer rate of the refrigerant is small, the heat transfer rate of the refrigerant is reduced by reducing a passage sectional area to increase the flow rate of the refrigerant. In this way, from the entrance to the exit of the refrigerant passage within the electrode, the values of heat transfer rate can be made flat. In the prior filed invention, as a concrete example, a refrigerant passage includes at least three passage regions connected successively in cascade from a passage regions is larger than that of other passage regions.

According to the prior filed invention, since the values of the heat transfer rate can be made flat from the entrance to the exit of the refrigerant passage within the electrode, the problems of the above JP-A No. 089864/2005, US 0081295A1/2007, and Japanese Patent Application No. 016881/2007 are significantly solved.

As a result of inventors' research, it was found that when heat inputted to a sample to be processed is almost the same as the capacity of a refrigerating cycle in a plasma processing apparatus, and a refrigerant can be evaporated to a dryout region within a refrigerant passage, the construction and the temperature control method of the prior filed invention are significantly effective. On the other hand, it was found that, in the case of a plasma processing apparatus in which an input heat quantity from plasma is large, the construction and the temperature control method of the prior filed invention may be insufficient. Specifically, in a plasma processing apparatus in which an input heat quantity from plasma is large, the capacity of a required refrigerating cycle is large. In a refrigerating cycle of large capacity, since the flow rate of a refrigerant circulating within a refrigerating cycle increases, the property of pressure loss must be taken into account. In this case, if a sectional area is reduced against dryout of the refrigerant near the exit of the refrigerant passage, pressure loss increases in a reduced region of a sectional area and evaporation temperature itself of the refrigerant may change.

Therefore, to the temperature of a wafer on an electrode highly efficiently, fast, and uniformly within a plane using a refrigerating cycle of direct expansion system, a study of electrode structure showing further improvement of the prior filed invention was required.

SUMMARY OF THE INVENTION

An object of the present invention is to provide a plasma processing apparatus and a plasma processing method that can control the in-plane temperature of a sample to be processed with high refrigerating efficiency and uniformly within a plane.

Another object of the present invention is to provide a plasma processing apparatus and a plasma processing method that can control the in-plane temperatures of a sample to be processed, highly efficiently, fast, and uniformly by restricting a change in the heat transfer rate and pressure loss of a refrigerant within a plane of an electrode.

To solve the above-described problems, a plasma processing apparatus of the present invention comprising a vacuum processing chamber; a sample stand having an electrode with electrostatic chuck within the vacuum processing chamber; a plasma generating means for generating plasma of a processing gas introduced into the vacuum processing chamber and processing the surface of a sample to be processed mounted on the electrode with electrostatic chuck by the plasma; and a refrigerating cycle including a compressor, a condenser, and an expansion valve which disposed outside the vacuum processing chamber, respectively, wherein the refrigerating cycle further includes a refrigerant passage provided in a lower portion of the electrode with electrostatic chuck of the sample stand as a first evaporator, wherein the refrigerant passage has a supply port and an ejection port provided in the sample stand, and the passage sectional areas of the refrigerant passage increase successively from the supply port to the ejection port, wherein the refrigerating cycle further includes a refrigerant evaporator functioning as a second evaporator that is disposed between the ejection port and the compressor and outside the vacuum processing chamber, and control means for controlling a refrigerant supplied to and ejected from the refrigerant passage, wherein the control means controls the flow rate of the refrigerant to prevent dryout from occurring in the first evaporator due to heat inputted from the sample to be processed, and wherein the refrigerant evaporator has a function to vaporize a refrigerant not evaporating within the refrigerant passage.

According to the present invention, by changing the sectional areas of a refrigerant passage within an electrode according to changes in heat transfer rate and pressure loss accompanying phase change of the refrigerant, the unevenness of heat transfer rate and pressure loss within the passage can be reduced, and temperatures within an electrode plane can be kept uniform. Specifically, in a state in which a refrigerant flow rate is controlled to prevent dryout from occurring within the refrigerant passage, by successively increasing the sectional areas of the refrigerant passage from a supply port to an ejection port, the unevenness of refrigerant capacity within the passage due to changes in the heat transfer rate of the refrigerant and pressure loss can be reduced, and temperatures within an electrode plane can be kept uniform.

BRIEF DESCRIPTION OF THE DRAWINGS

FIG. 4B is a drawing showing the properties of pressure loss of refrigerant for explaining the operation and effect of the present invention;

DETAILED DESCRIPTION OF THE PREFERRED EMBODIMENTS

Examples of a plasma processing apparatus to which the present invention is applied will be described as preferred embodiments for implementing the present invention. A temperature adjustment unit in the plasma processing apparatus proposed in the present invention is not limited to only embodiments described below. The present invention can also apply to plasma-using vacuum processing apparatuses such as ashing apparatus, sputter apparatus, ion injecting apparatus, plasma CVD apparatus that require high-speed and uniform wafer temperature control within a surface.

First Embodiment

A plasma processing apparatus of a first embodiment of the present invention is described referring to FIGS. 1 to 4B.

Figure 1:
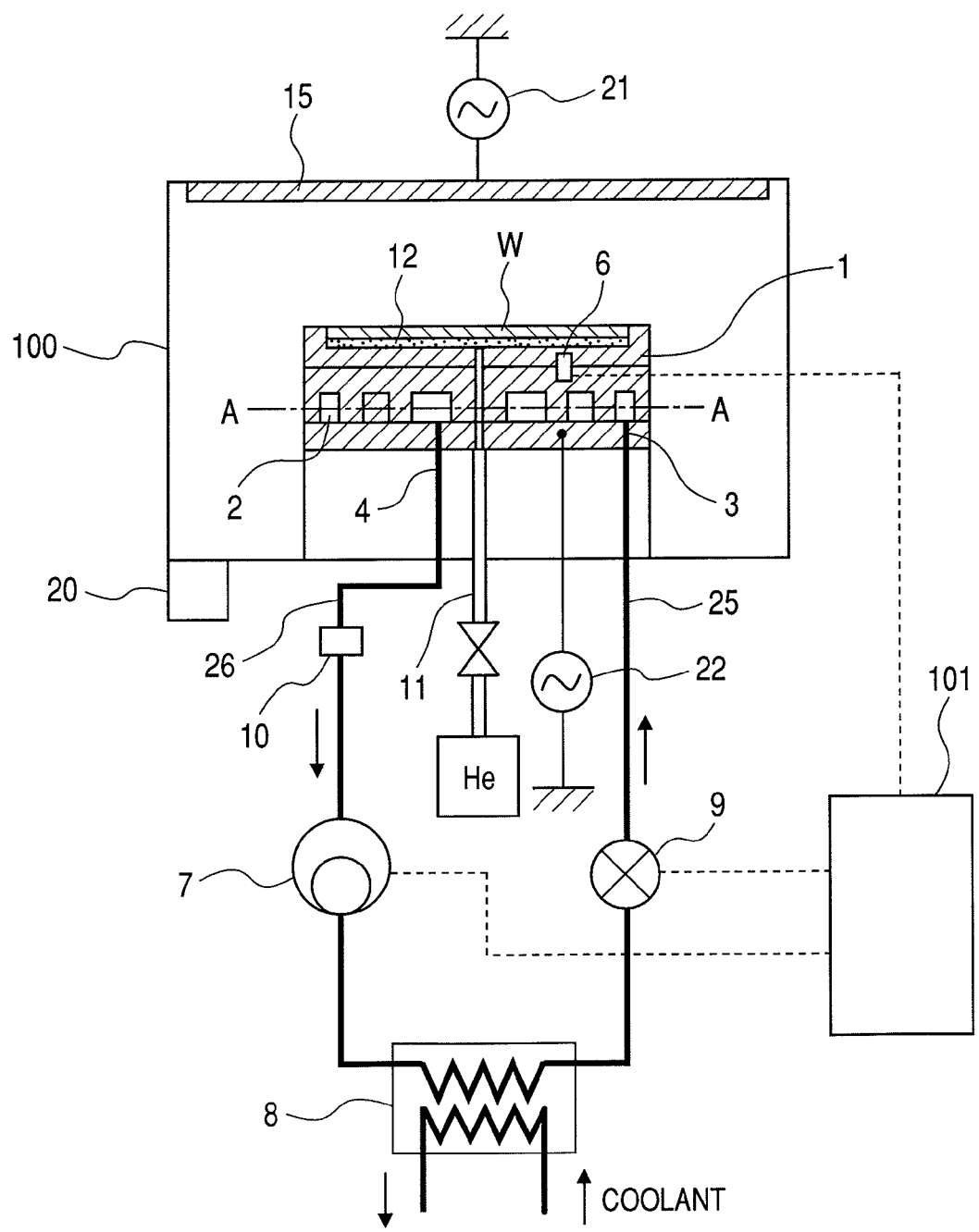
FIG. 1 is a schematic view showing of an overall system configuration of a plasma processing apparatus of the present invention.

FIG. 1 is a schematic view showing of an overall system configuration of the plasma processing apparatus of the first embodiment of the present invention. The plasma processing apparatus includes a processing chamber 100 disposed within a vacuum vessel, and a sample stand 1 including an electrostatic attracting electrode is disposed within the processing chamber 100. The processing chamber 100 is connected to a vacuum evacuation apparatus 20 such as a vacuum pump for decreasing pressure by evacuating its inside. An electrode plate 15 is provided in an upper portion of the processing chamber 100, which is connected to an antenna power supply 21. The antenna power supply 21 is connected to a high frequency power supply for plasma generation. Gas introducing means such as a shower plate (not shown) that supplies processes gases for plasma generation is provided in an upper portion of the processing chamber 100.

A dielectric film for electrostatic attraction is provided in the sample stand 1, and an upper surface of the dielectric film is formed as a sample mounting surface for mounting a substrate (wafer) W to be treated. The sample stand 1 is provided with in-electrode refrigerant passages (hereinafter simply referred to as a refrigerant passage) 2 within which refrigerant circulates. The gas 12 for heat transfer is supplied from a heat transfer gas supply system 11 to a minute clearance of wafer back surface on the sample mounting surface of the sample stand 1. To the sample stand 1, a bias power supply 22 that applies a high frequency electric power for bias, and a DC power supply for electrostatic attraction (not shown) are connected.

To the refrigerant passage 2 provided in the sample stand 1, a refrigerant supply (entrance) port 3 connected to a refrigerant pipe 25 and a refrigerant ejection (exit) port 4 connected to a refrigerant pipe 26 are connected. As shown in FIG. 1, the vertical cross sections of the refrigerant passage 2 is of rectangular shape of constant height, and their sectional areas (width) are the smallest in the outer circumference side (entrance side) and the largest in the inner circumference side (exit side). The refrigerant passages (first evaporators) 2 constitute a refrigerant cycle along with a compressor 7, a condenser 8, an expansion valve 9, a refrigerant evaporator 10 (second evaporator), and refrigerant pipes 25, 26 for connecting them. The refrigerant passage 2 provided in the sample stand 1 constitute an evaporator of a direct expansion system (or a heat cycle of a direct expansion system). That is, the sample stand 1 contacting with the refrigerant is cooled by latent heat (heat of vaporization) when the refrigerant evaporates within the refrigerant passage 2 within the sample stand 1. For the refrigerant, for example, hydrofluorocarbon is used. The refrigerant evaporator 10 has a function to evaporate refrigerant not evaporating within the refrigerant passage 2. For example, coolant for heat exchange of the condenser 8 may be guided to the refrigerant evaporator 10 to evaporate the refrigerant by heat of the coolant.

Adjacent to the sample mounting surface, plural temperature sensors 6 are provided within the sample stand 1. The reference numeral 101 designates a temperature control system that controls the temperature of the substrate (wafer) W to be processed to a desired value by controlling the rotating speed of the compressor 7 and the opening of the expansion valve 9, based on output from the temperature sensor 6. The temperature of the wafer W depends on processing conditions for plasma etching, that is, heat inputted to the wafer W. Therefore, the temperature control system maintains the temperature of the wafer W at a desired value by controlling the flow rate of refrigerant flowing through the refrigerant passage 2, refrigerant pressure (refrigerant evaporation temperature), and the like, based on temperatures detected by the temperature sensor 6.

In the present invention, for the refrigerant passage 2 constituting the evaporator, the temperature control system 101 controls a refrigerant flow rate to prevent a refrigerant within the refrigerant passages from drying out. The refrigerant passage 2, which include plural regions, is constructed so that passage sectional areas of the regions increase successively from the supply port 3 to the ejection port 4. Although the vertical section of the refrigerant passages is preferably rectangular in terms of easy processing, it is not limited to the shape.

Figure 2:
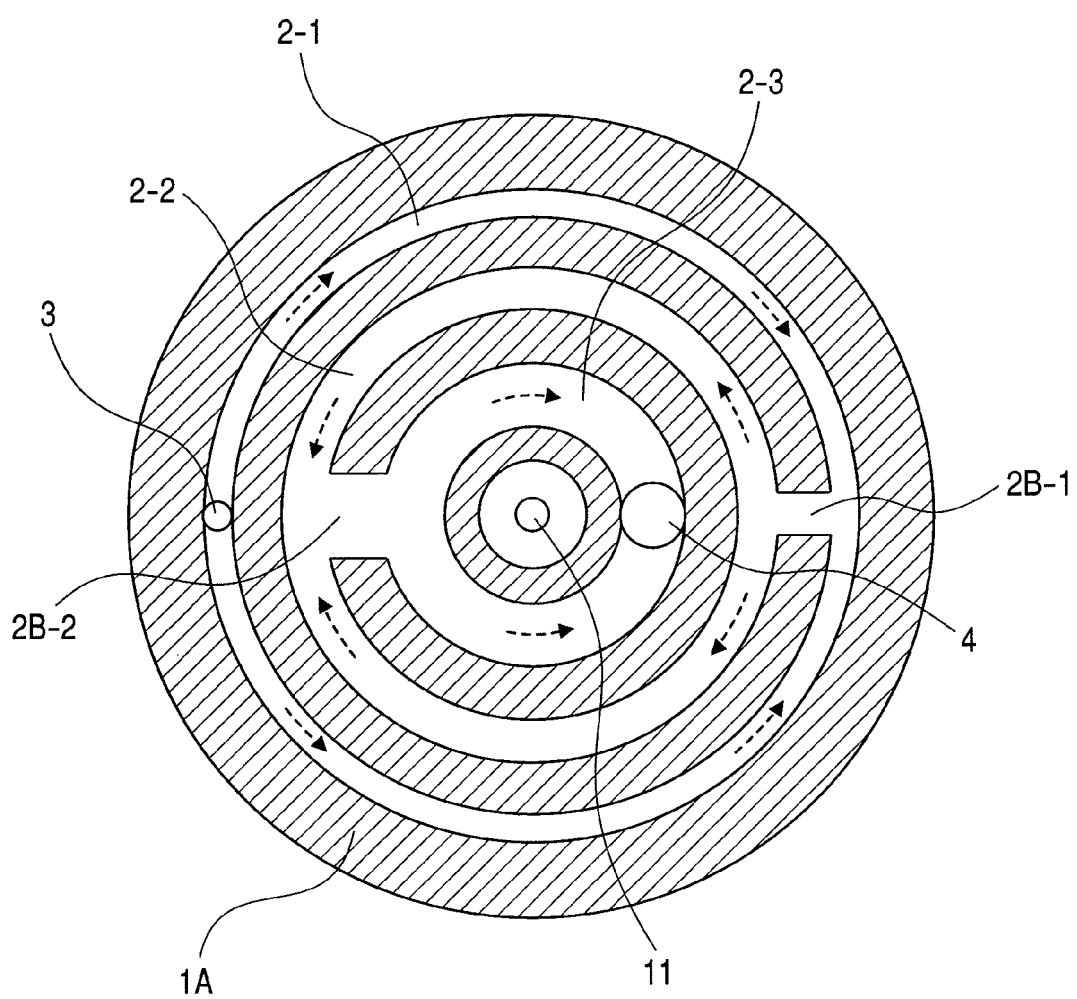
FIG. 2 is a schematic diagram showing a first embodiment of a passage structure within a sample stand of the present invention, which shows a cross section taken along the line A-A of FIG. 1.

The successive increases of the passage sectional areas are described referring to FIG. 2. FIG. 2 shows a cross section taken along the line A-A of FIG. 1. In FIG. 2, in a position of the same height as the sample stand 1, ring-shaped refrigerant passage 2 (of plural regions) is formed. Specifically, the refrigerant passage 2 include ring-shaped first passage 2-1 of substantially same width that are connected to the refrigerant supply port 3 provided in the outer circumference of the sample stand 1 and branch in both right and left directions, ring-shaped second passage 2-2 of substantially same width that branch in both right and left directions via a first contact passage 2B-1, and ring-shaped third passage 2-3 of substantially same width that branch in both right and left directions via a second contact passage 2B-2, wherein the third passage 2-3 is connected to the refrigerant ejection port 4 provided in the inner circumference side of the sample stand 1. The passage sectional areas of the regions of the refrigerant passage 2 increase in stages successively from the first passage 2-1 to the third passage 2-3 in this embodiment. The passage sectional areas of the right and left first passage 2-1, second passage 2-2, and third passage 2-3 are substantially half or slightly large with respect to the passage sectional areas of their upstream refrigerant supply port 3, first contact passage 2B-1, and second contact passage 2B-2, respectively. The sectional area of the refrigerant ejection port 4 is substantially equal to or slightly larger than the sum of the sectional areas of the right and left third passage 2-3.

Although, in FIG. 1, the refrigerant pipe 25 connecting the expansion valve 9 and the refrigerant supply port 3 and the refrigerant pipe 26 connecting the refrigerant ejection port 4 and the compressor 7 are schematically shown by thin lines, respectively, it goes without saying that their sectional areas are set to proper sizes without impairing the operation and effect of the refrigerant passage 2 within the sample stand 1. Specifically, the sectional area of the refrigerant supply port 3 is substantially equal to or slightly larger than the sectional area of the refrigerant pipe 25 from the expansion valve 9 at its upstream side to the refrigerant supply port 3. The sectional area of the refrigerant ejection port 4 is substantially equal to or smaller than the sectional area of the refrigerant pipe 26 from the refrigerant ejection port 4 at its downstream side to the compressor 7.

A refrigerant flow liquidly from the refrigerant supply port 3 to the refrigerant passage 2 flows from the refrigerant ejection port 4 in two-phase state of liquid and gas after cooling the sample stand 1 by latent heat of vaporization. Since the heat transfer rate $\alpha$ of the refrigerant changes greatly from the refrigerant supply port 3 to the refrigerant ejection port 4, to keep the heat transfer rate $\alpha$ of the refrigerant constant within the refrigerant passage 2, the sectional areas of the refrigerant passages are constructed to increase successively from the first passage 2-1 to the third passage 2-3. By this construction, a rise in the heat transfer rate of the refrigerant is suppressed by reducing the flow rate of the refrigerant in a dryness degree region in which the heat transfer rate $\alpha$ of the refrigerant rises. Thus, the refrigerant passage 2 of the present invention are constructed to keep the heat transfer rate of a refrigerant in each region of a relevant refrigerant passage almost unchanged regardless of the dryness degree of the refrigerant.

The following describes the relationship among the sectional area of a refrigerant passage characterizing the present invention, refrigerant dryness degree (X), heat transfer rate ($\alpha$), and pressure loss $\Delta P$ with reference to FIGS. 3A and 3B, and FIGS. 4A and 4B.

Figure 3A:
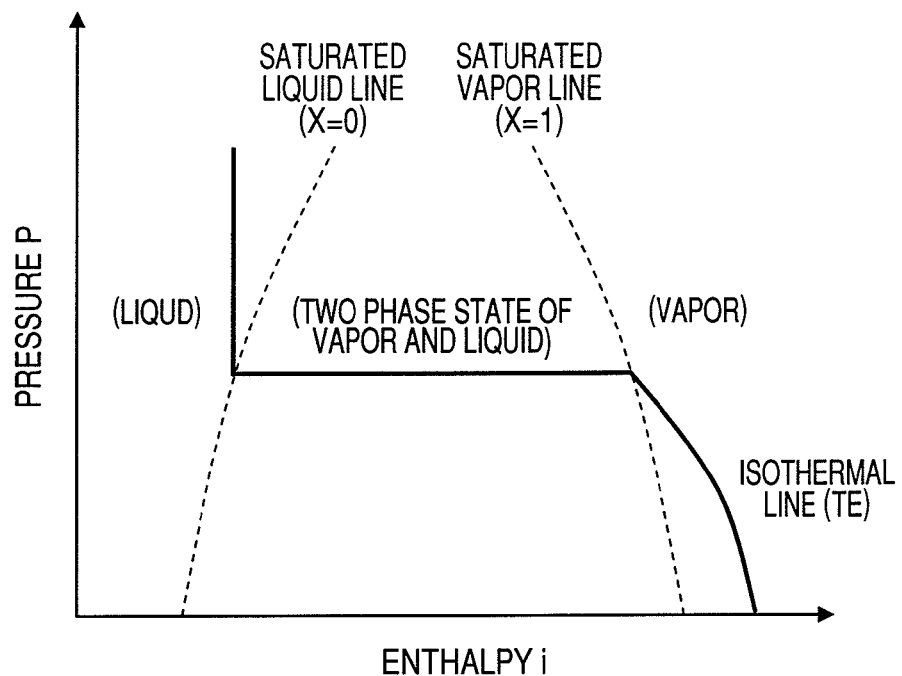
FIG. 3A is a graph showing general properties of refrigerant in a refrigerating cycle adopted in the present invention.

FIG. 3A is a graph showing general properties of a refrigerant in a refrigerating cycle adopted in the present invention. In this embodiment, the sample stand 1 contacting with the refrigerant is cooled by latent heat (heat of vaporization) when the refrigerant evaporates within the refrigerant passage 2 within the sample stand 1. Within the refrigerant passage 2 in which heat exchange (evaporation) of the refrigerant occurs, the refrigerant is in a two phase state of vapor and liquid (dryness degree X=0 to 1), and the evaporation temperature TE of the refrigerant is theoretically constant as long as pressure P of the refrigerant is constant in this state.

Figure 3B:
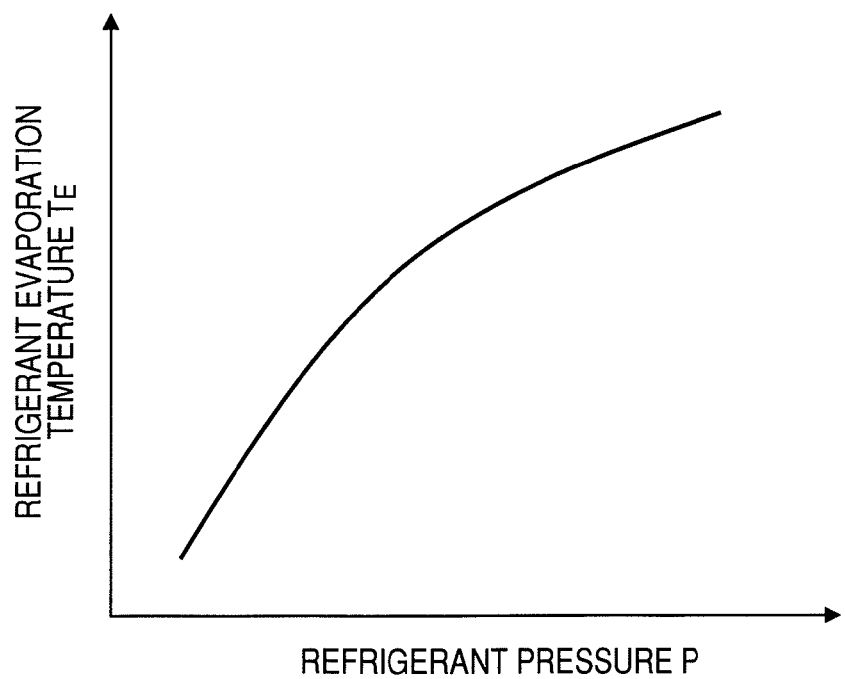
FIG. 3B is an explanatory drawing showing general properties of evaporation temperatures of refrigerant.

On the other hand, as shown in FIG. 3B, basically, temperatures TE of the refrigerant rise as pressure P of the refrigerant increases.

Accordingly, in the present invention, a refrigerant temperature TE within the refrigerant passage 2 is set by controlling pressure P of the refrigerant by the opening of the expansion valve 9 and adjusting the flow rate Q of the refrigerant by the rotating speed of the compressor 7.

Figure 4A:
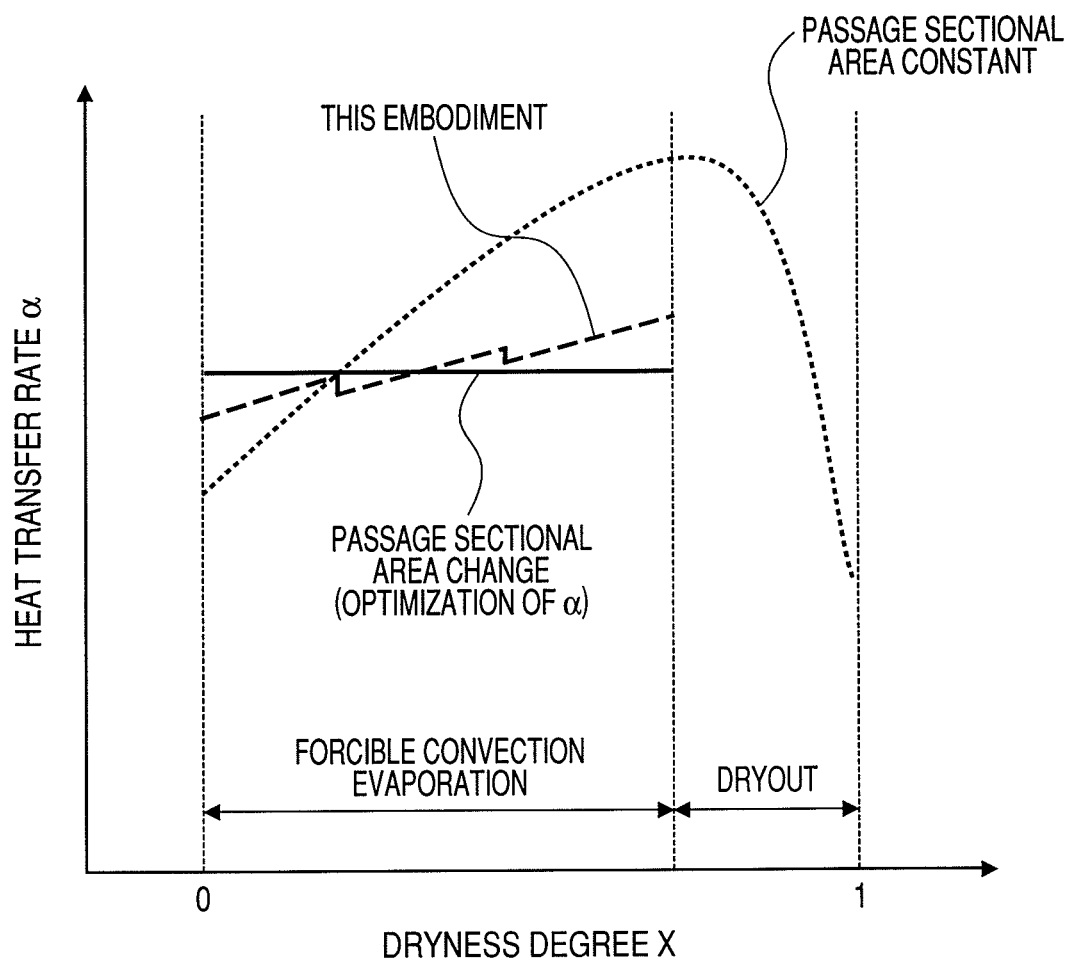
FIG. 4A is a drawing showing the properties of heat transfer rate of refrigerant for explaining the operation and effect of the present invention.

FIG. 4A shows the properties of refrigerant heat transfer rate $\alpha$ of a refrigerating cycle of direct expansion system, and FIG. 4B shows the properties of pressure loss $\Delta P$. Graphs of "Passage sectional area change" shown in solid lines in FIGS. 4A and 4B show cases where passage sectional areas of plural regions are continuously changed to ideal values, based on the present invention, and graphs of "This embodiment" shown in bold dotted lines correspond to the passage sectional shape expanding in stages shown in FIG. 2. Graphs of "Passage sectional area constant" shown in thin dotted lines show conventional genera passage construction, that is, the relationship among dryness degree X, heat transfer rate $\alpha$, and pressure loss $\Delta P$ in a case where the passage sectional area of each region from the entrance 3 to the exit 4 of the refrigerant passage 2 is constant.

A refrigerating cycle of direct expansion system performs cooling using latent heat when a refrigerant evaporates from liquid to vapor, and evaporation temperatures of the refrigerant can be controlled by pressure.

As described in FIGS. 3A and 3B, even when the ratio (dryness degree X) of liquid and vapor changes, refrigerant is unchanged in evaporation temperature TE if pressure P is constant. However, when the evaporation of the refrigerant develops and a dryness degree changes, in the case of "Passage sectional area constant," the heat transfer rate $\alpha$ changes greatly as shown by a thin dotted line in FIG. 4A. On the other hand, as shown in a thin dotted line in FIG. 4B, when a dryness degree changes greatly because of the evaporation of the refrigerant, pressure loss $\Delta P$ of the refrigerant produced per unit length of the refrigerant passage also changes greatly.

In a refrigerating cycle of direct expansion system, in a process of phase-changing from liquid to vapor, the heat transfer mode of a refrigerant changes to forcible convection vaporization and dryout. The forcible convection vaporization starts from the start of refrigerant vaporization, then the heat transfer rate $\alpha$ and pressure loss rise as the dryness degree X rises. When the dryness degree X of the refrigerant has become constant, dryout (disappearance of a liquid film) occurs and the heat transfer rate $\alpha$ and pressure loss $\Delta P$ decreases. However, the pressure loss $\Delta P$ does not decrease rapidly unlike the heat transfer rate $\alpha$. Thus, in the refrigerating cycle of direct expansion system, since the heat transfer rate $\alpha$ and pressure loss $\Delta P$ change greatly depending on the dryness degree X of refrigerant, when the refrigerating cycle of direct expansion system is adopted as a refrigerating mechanism for wafer as described previously, temperature distribution control within the wafer surface is a technical problem.

For example, in a refrigerating cycle of direct expansion system of 4 kW class, when R410 is used for a refrigerant, and a ¼ inch pipe (inside diameter of about 5 mm, passage length of about 2 m, and inside wall without projections and depressions) of constant sectional area is used for a refrigerant passage, and when a refrigerant flow rate is 1 L/min and a dryness degree changes from 0 to 0.9), refrigerant pressure loss ΔP within the passage reaches 0.07 MPa immediately before the end of evaporation and an about 3° C. worth of refrigerant temperature changes. A change in refrigerant heat transfer rate α is added to this, resulting in temperature uniformity of an electrode surface further deteriorating.

As described in the prior filed invention, to restrict a change of heat transfer rate α occurring due to dryout, reduction in a sectional area near the ejection port 4 increases pressure loss near the ejection port 4 and makes it difficult to obtain exact uniformity within the plane.

On the contrary, as described above, to control heat transfer rate α and pressure loss ΔP involved in a phase change of refrigerant to obtain temperature uniformity within the wafer surface, the present invention controls a refrigerant flow rate to prevent dryout from occurring in a refrigerant within the refrigerant passage 2, and increase successively the sectional areas of individual regions of the refrigerant passage 2 from the supply port 3 to the ejection port 4, corresponding to phase change of the refrigerant.

Thus, the present invention is characterized in that, based on the premise that no dryout region is used, the sectional areas of individual regions of a disposed refrigerant passage increase successively from the supply port 3 to the ejection port 4, corresponding to changes in the heat transfer rate α and pressure loss ΔP of the refrigerant.

Specifically, in general properties of constant passage sectional areas shown in FIG. 4A, in a position corresponding to a large heat transfer rate α of a refrigerant, that is, a region near the refrigerant ejection port 4, a passage sectional area is expanded to decrease the flow rate of the refrigerant, thereby reducing the heat transfer rate α of the refrigerant. As a result, in a place where pressure loss ΔP is large in FIG. 4B, that is, a region near the refrigerant ejection port 4, a passage sectional area is expanded, so that pressure loss is curbed. By the above-described construction, ultimately, the properties of the heat transfer rate α between the supply port 3 and the ejection port 4 of the refrigerant passage 2 are made nearly flat, and a change in refrigerant temperatures due to pressure loss ΔP can be reduced.

To make the refrigerant heat transfer rate α uniform, in an ideal state ("optimization of passage sectional areas) in which the sectional areas of the refrigerant passage 2 are continuously changed (expanded) to expand as the heat transfer rate α of the refrigerant increases, the heat transfer rate α of the refrigerant can be made constant regardless of the magnitude of the dryness degrees of the refrigerant, as shown in a solid line in FIG. 4A. Likewise, if the degree of expansion of sectional areas of the refrigerant passage 2 is determined to curb the pressure loss ΔP, the pressure loss ΔP can be curbed to such a nearly flat level as to increase little regardless of a change in the dryness degree X, as shown in a solid line of FIG. 4B. Thus, it is substantially difficult to make the pressure loss ΔP wholly flat as sectional areas of the refrigerant passage 2 expand continuously.

Practically, as shown by this embodiment, the ease of the working of passage grooves is taken into consideration, the sectional areas of plural areas are changed in stages to increase successively toward the latter part of a passage region from the supply port 3 to the ejection port 4 of the refrigerant passage 2. By this construction, the heat transfer rate α of the refrigerant within the passage can be made nearly flat regardless of the dryness degree of the refrigerant, and significant effects are obtained in curbing the pressure loss ΔP.

For example, as shown by the embodiment of FIG. 2, a refrigerant passage is formed by three concentric circles, and when their sectional areas are changed in three stages (successive increase), although the heat transfer rate α of a refrigerant changes according to the magnitude of the dryness degree X of the refrigerant as shown in a dashed line in FIG. 4A, its variation is below a third in comparison with when sectional areas are constant.

Thus, by successively increasing the sectional areas of the refrigerant passage 2 provided in a base 1A toward the ejection port 4 from the supply port 3, the heat transfer rate α of a refrigerant can be made uniform and the pressure loss ΔP can be curbed.

Specifically, in a state in which refrigerant flow rate is controlled to prevent dryout from occurring within the refrigerant passage 2, by making a structure in which sectional areas of the refrigerant passage increase successively toward the ejection port 4 from the supply port 3, the unevenness of refrigerant evaporation temperatures due to the pressure loss ΔP can be curbed while reducing changes in the heat transfer rate α due to a phase change in the refrigerant, and temperatures within an electrode surface can be kept uniform. In this way, according to this embodiment, heat transfer rate α is almost uniform among regions within the refrigerant passage, and the surface temperature of an electrode and wafer temperature can be controlled uniformly within the plane.

In vapor-liquid two-phase flow of a refrigerating cycle of direction expansion system, an increase in the flow rate of a refrigerant increases the heat transfer rate α as a flow rate increases, like normal fluid.

When the sectional area A of the refrigerant passage 2 is changed in three steps in three regions as shown in the embodiment, a relation of the sectional area A1 of a first passage<the sectional area A2 of a second passage<the sectional area A3 of a third passage needs to be satisfied. The refrigerant passage 2 requires two contact passages 2B (2B-1, 2B-2) for connection between the passages. The contact passages 2B should be located in opposite positions with respect to a lower electrode 1B, to pass the refrigerant equally through the refrigerant passage 2. Furthermore, it is desirable that the sectional area of the contact passage 2B-1 is twice or more as large as the sectional area A1 of the first passage 2-1. It is desirable that the sectional area of the contact passage 2B-2 is twice or more as large as the sectional area A2 of the second passage 2-2.

The following briefs a procedure for etching the wafer W by the apparatus of FIG. 1. The wafer W is conveyed to the processing chamber 100 from an apparatus for transferring an object to be treated (not shown), mounted on the sample mounting surface of the sample stand 1, and fixed by electrostatic absorption. Then, a process gas necessary for etching the wafer W is supplied by a gas line not shown, and the processing chamber 100 is adjusted to a specific processing pressure by the vacuum evacuation apparatus 20. Next, plasma of the process gas is generated by a high frequency power supplied from the antenna power supply 21 and the bias power supply 22, and the effect of a magnetic field generated by magnetic field forming means not shown, and etching processing is started using the plasma. Wafer temperatures during the process are feedback-controlled in the temperature control system 101 while monitoring temperature information from the temperature sensor 6, and a refrigerant flow rate and evaporation temperatures are adjusted by adjusting the compressor 7 and the expansion valve 9. Since the refrigerant passage 2 within the sample stand 1 is constructed so that its sectional areas change according to changes in the heat transfer rate α and pressure loss ΔP of the refrigerant as shown in FIG. 2, in-plane distribution of cooling capacity due to a phase change of the refrigerant is reduced, and in-plane temperatures of the sample stand 1 can be uniformly and rapidly controlled.

When heat inputted to a sample to be processed and the capability of a refrigerating cycle are almost the same, and a refrigerant is evaporated to a dryout region within a refrigerant passage, the apparatus construction and a temperature control method of the prior filed invention become effective. In other words, when the capability of a refrigerating cycle is far superior to a heat inputted to a sample to be processed, further in-plane temperature uniformity can be achieved by the present invention.

Figure 5:
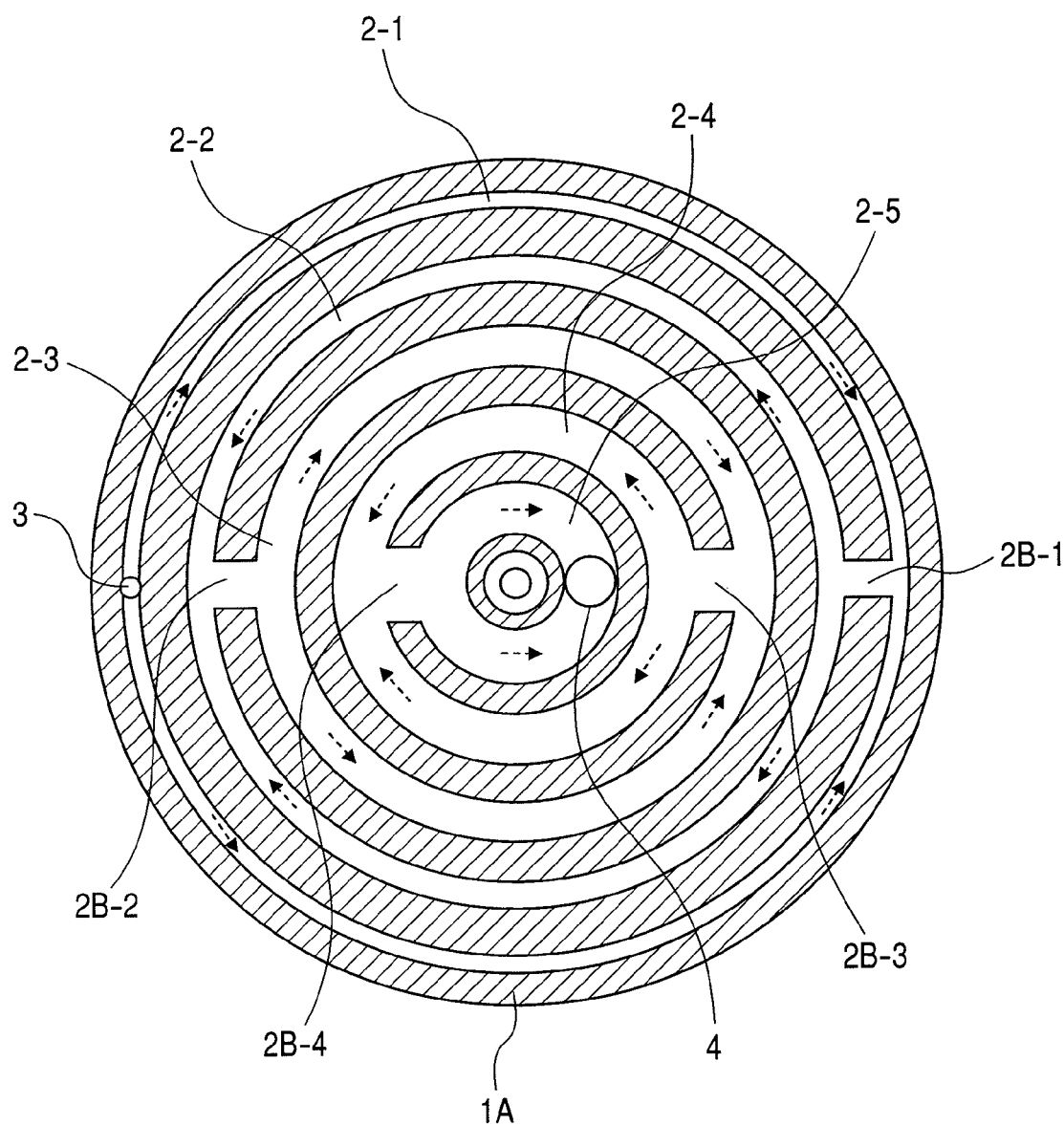
FIG. 5 is a schematic diagram showing a second embodiment of a passage structure within a sample stand of the present invention.

When the present invention is adopted, to control a temperature distribution of the sample stand 1 more accurately and uniformly, regions of the refrigerant passage 2 need to be more multidimensional. As a second embodiment of the present invention, an example of making regions of the refrigerant passage multidimensional (five stage change) is shown in FIG. 5. The refrigerant passage 2 includes a first passage 2-1 that is connected to the refrigerant supply port 3 provided near the outer circumference end of the sample stand 1 and branches in both right and left directions, a second passage 2-2 that branches in both right and left directions via a first contact passage 2B-1, a third passage 2-3 that branches in both right and left directions via a second contact passage 2B-2, a fourth passage 2-4 that branches in both right and left directions via a third contact passage 2B-3, and a fifth passage 2-5 that branches in both right and left directions via a fourth contact passage 2B-4. The fifth passage 2-5 is connected to the refrigerant ejection port 4 provided near the center of the sample stand 1.

Also in this case, by making a construction in which the sectional area of each region of the refrigerant passage expands toward the ejection port 4 from the supply port 3 in which the heat transfer rate α of the refrigerant increases, a property closer to the flat (optimum) property shown in a solid line in FIG. 4A can be obtained. By this construction, pressure loss ΔP can also be curbed, with the result that the temperature of the wafer on the sample stand 1 can be controlled uniformly within the plane.

Third Embodiment

In the examples shown in FIGS. 2 and 5 above, the mounting positions of the refrigerant supply port and the refrigerant ejection port 4 may be reverse. In this case, however, using FIG. 2 as an example, the relation of the sectional areas a of the first passage 2-1 and the third passage 2-3 must be reversed, and the relation of the sectional areas of the contact passage 2B-1 and 2B-2 must also be reversed.

Fourth Embodiment

Figure 6:
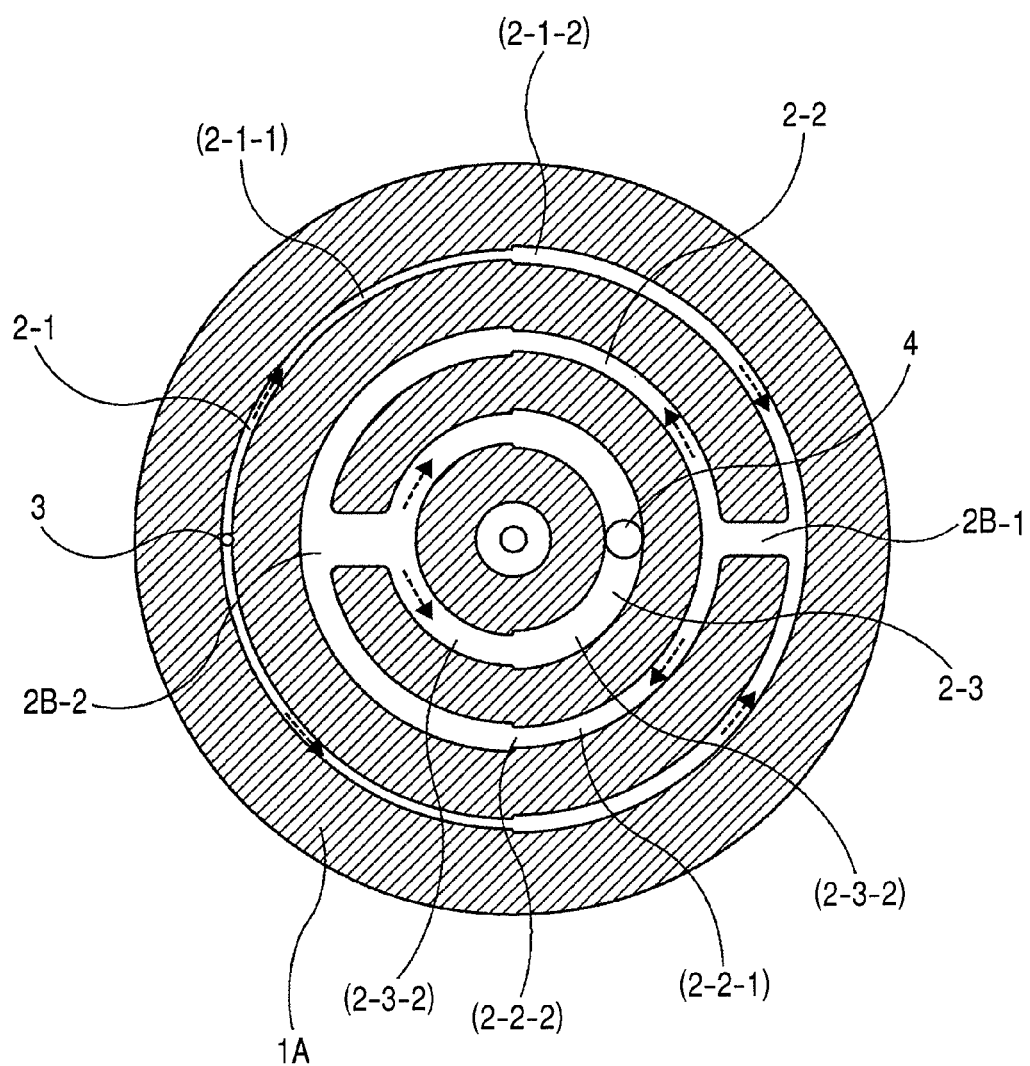
FIG. 6 is a schematic diagram showing a fourth embodiment of a passage structure within a sample stand of the present invention.

The refrigerant passage may be constructed so that sectional areas increase successively within each region partitioned by the refrigerant supply port, the contact passages, and the refrigerant ejection port. FIG. 6 shows an example of the construction of the refrigerant passage in which sectional area A changes in stages within each region of the refrigerant passage. The refrigerant passage 2 is constructed so that sectional areas expand successively in stages within three regions (passages 2-1, 2-2, and 2-3). That is, changes (expansions) in two steps occur such as 2-1-1 and 2-1-2 within the passage 2-1, 2-2-1 and 2-2-2 within the passage 2-2, and 2-3-1 and 2-3-2 within the passage 2-3, respectively. Sectional areas of the refrigerant passage 2 may change (expand) continuously within each region.

By this construction, a change in heat transfer rate α of a refrigerant within each passage can be curbed, a property closer to the flat (optimum) property shown in a solid line in FIG. 4A can be obtained. Moreover, pressure loss ΔP can also be reduced, and the difference between wafer temperatures can be reduced.

Figure 7:
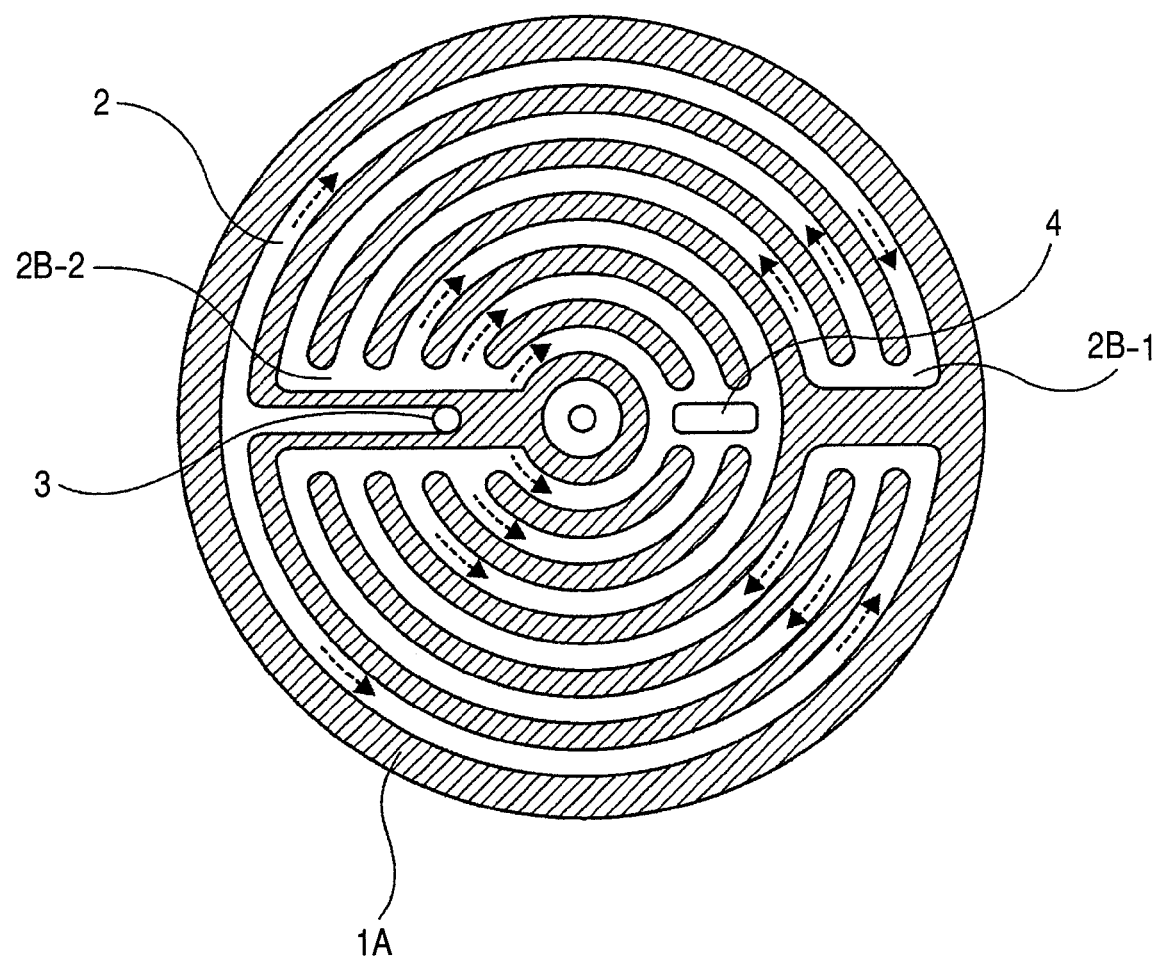
FIG. 7 is a schematic diagram showing a fifth embodiment of a passage structure within a sample stand of the present invention.

FIG. 7 shows an example of expanding the sectional area of the refrigerant passage 2 by the number of passages. The sectional area A of a passage of each region is made almost equal, and a passage that branches in two directions in the refrigerant supply port 3 increases the number of passages via contact passages 2B-1 and 2B-2 as the heat transfer rate α of the refrigerant increases, with the result that the sectional area of the refrigerant passage is increased. Then, these plural passages are integrated into one passage, then connected to the refrigerant ejection port 4. (In the embodiment, the passage 2 that branches in right and left directions from the refrigerant supply port 3 increases the number of passages to four via the contact passage 2B-1, and further increases it to six via the contact passage 2B-2 before the six passages are integrated into one, with the result that the passage is connected to the refrigerant ejection port 4 without decreasing the sectional area.) By this construction, a rise in the heat transfer rate α of the refrigerant in the drying region in which the heat transfer rate α of the refrigerant increases, and pressure loss can be curbed, the cooling capacity of the refrigerant can be made substantially constant within the refrigerant passage 2, and wafer temperatures on the sample stand 1 can be controlled uniformly within the plane.

Sixth Embodiment

Figure 8:
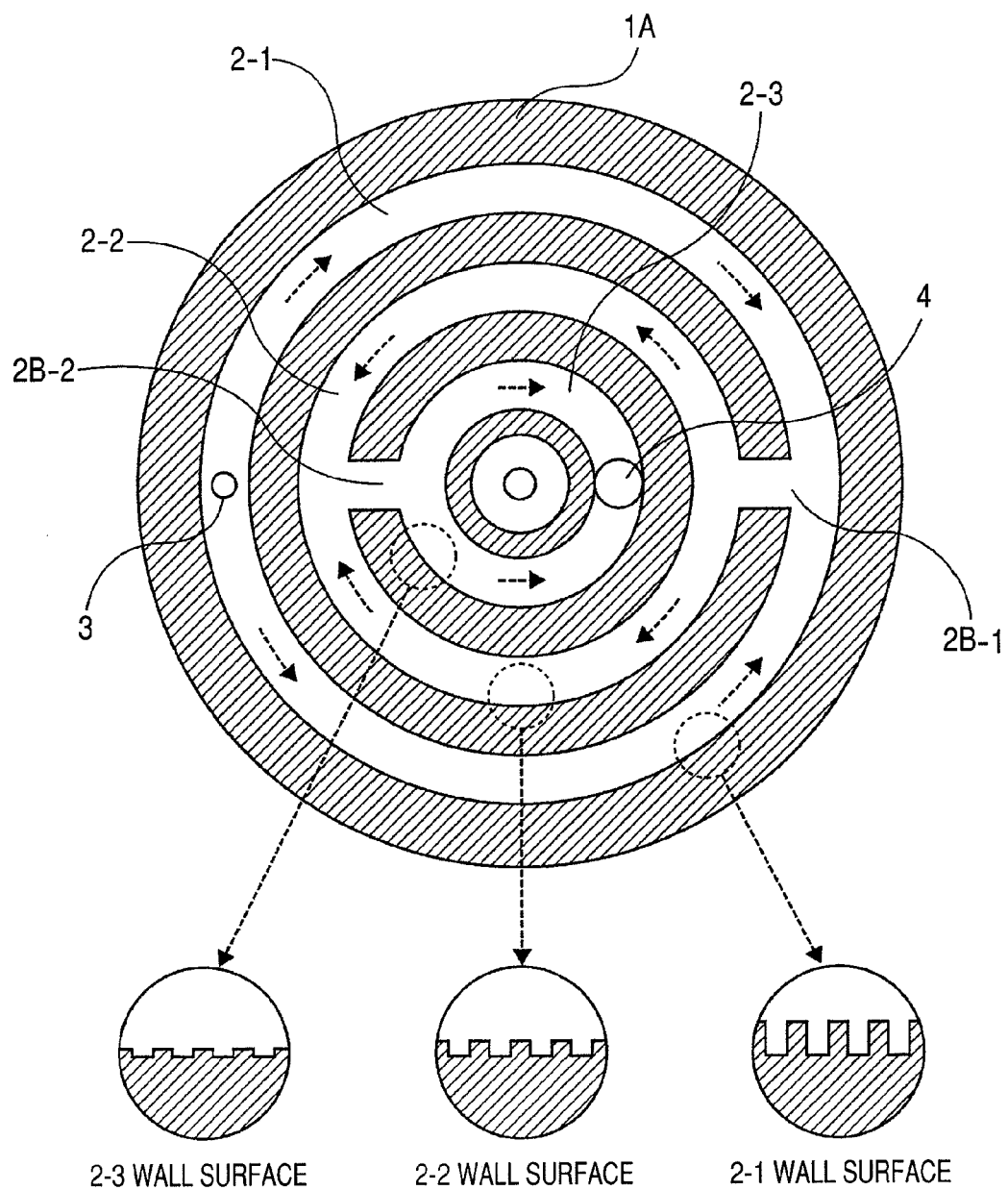
FIG. 8 is a schematic diagram showing a sixth embodiment of a passage structure within a sample stand of the present invention.

FIG. 8 shows another embodiment that controls heat transfer rate α and pressure loss ΔP of each region within a passage in the shape of inner wall of the refrigerant passage 2. If projections and depressions are provided in inner walls of the refrigerant passage 2, since the agitation (convection) of a refrigerant and heat transfer areas increase, heat transfer rate α rises. On the other hand, the projections and depressions cause pressure loss ΔP. Accordingly, in the dryness degree region (2-3 in the drawing) in which the heat transfer rate α of the refrigerant and pressure loss ΔP are high, the projections and depressions of the inner walls of the refrigerant passage 2 are made low (may be inexistent) to curb a rise in the heat transfer rate α and pressure loss ΔP. In the dryness degree region (2-1 and 2-2 in the drawing) in which the heat transfer rate α of the refrigerant and pressure loss ΔP are low, the projections and depressions are made high (the height of the projections and depressions is made so that 2-1 in the drawing>2-2 in the drawing). Thereby, the pressure loss ΔP can be curbed while keeping the heat transfer rate α within each region of the refrigerant passage 2 constant. If the height of the projections and depressions is 2% or more of refrigerant passage width (diameter), heat transfer rate can be increased. Since excessively high projections and depressions cause a problem with pressure loss, the height of projections and depressions is preferably about 2 to 10% of refrigerant passage width (diameter). If the projections and depressions are disposed slant with respect to a refrigerant advance direction, a heat transfer rate can be increased while curbing pressure loss.

Seventh Embodiment

In the embodiment of the present invention shown above, when a dryness degree is about 0.8, the heat transfer rate of refrigerant becomes maximum. In actual conditions, however, depending on the type of refrigerant to be used, the inner wall shape of a refrigerant passage, or refrigerant rate, a dryness degree X in which a heat transfer rate becomes maximum changes. For example, a heat transfer rate becomes maximum between 0.5 to 0.9 of dryness degree, and after that, it is conceivable that dryout occurs. In contrast to this, in the present invention, to prevent dryout from occurring within a refrigerant passage, a refrigerant flow rate must be managed to a proper rate.

Therefore, as a second embodiment of the present invention, by estimating the quantity of heat inputted from plasma before starting etching processing and excessively increasing a refrigerant flow rate with respect to the inputted heat quantity, dryout needs to be prevented from occurring within the refrigerant passage.

In the case of two-phase flow state of vapor and liquid, the relationship between pressure and evaporation temperature is as shown in FIG. 3B, and the pressure and evaporation temperature each are determined depending on a refrigerant to be used. Specifically, when the refrigerant evaporates completely to superheated vapor and the relation of FIG. 3B is not satisfied, it can be determined that the refrigerant evaporates completely. When it is necessary to quantitatively know the dryness degree of the refrigerant ejected from the refrigerant passage, refrigerant heating means may be disposed after the refrigerant passage to estimate the dryness degree of the refrigerant from an inputted heat quantity when the refrigerant is completely evaporated by the heating means.

Figure 9:
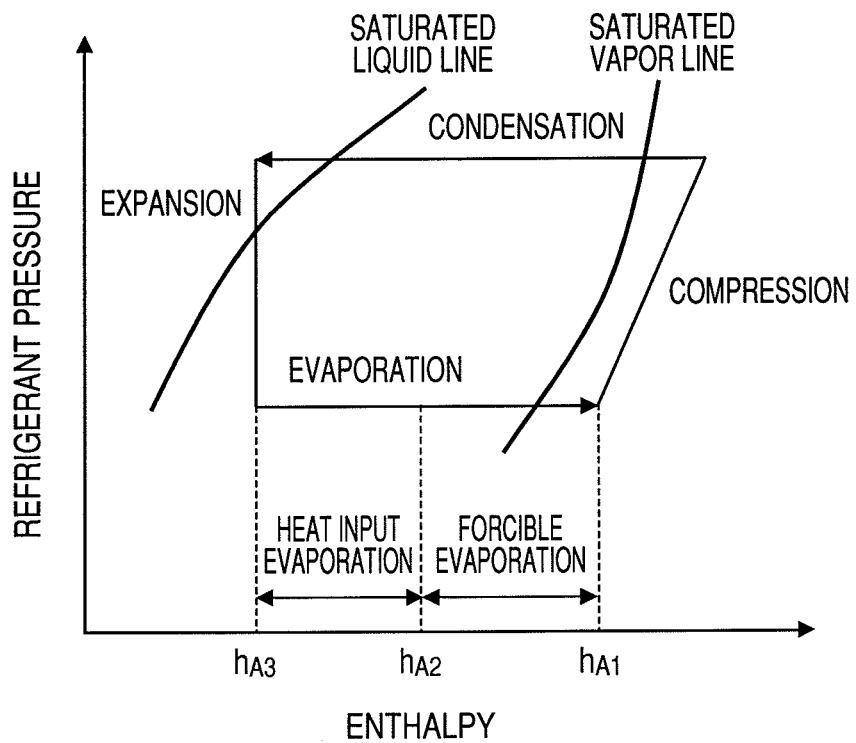
FIG. 9 is an explanatory drawing showing evaporation properties of refrigerant of a seventh embodiment of a plasma processing apparatus of the present invention.

In the present invention, since a refrigerant passage through the refrigerant passage 2 without completely evaporating, the refrigerant flows liquidly into the compressor, possibly damaging the compressor. The refrigerant not completely evaporated within the refrigerant passage may be completely evaporated by the refrigerant evaporator 10 disposed after the refrigerant passage. Specifically, as shown in FIG. 9, the refrigerant may be completely evaporated by evaporation (input heat evaporation) by a heat quantity $h_{A2}$-$h_{A3}$ inputted from plasma and evaporation (forcible evaporation) by a heat quantity $h_{A1}$-$h_{A2}$ inputted from the refrigerant evaporator 10.

Eighth Embodiment

Figure 10:
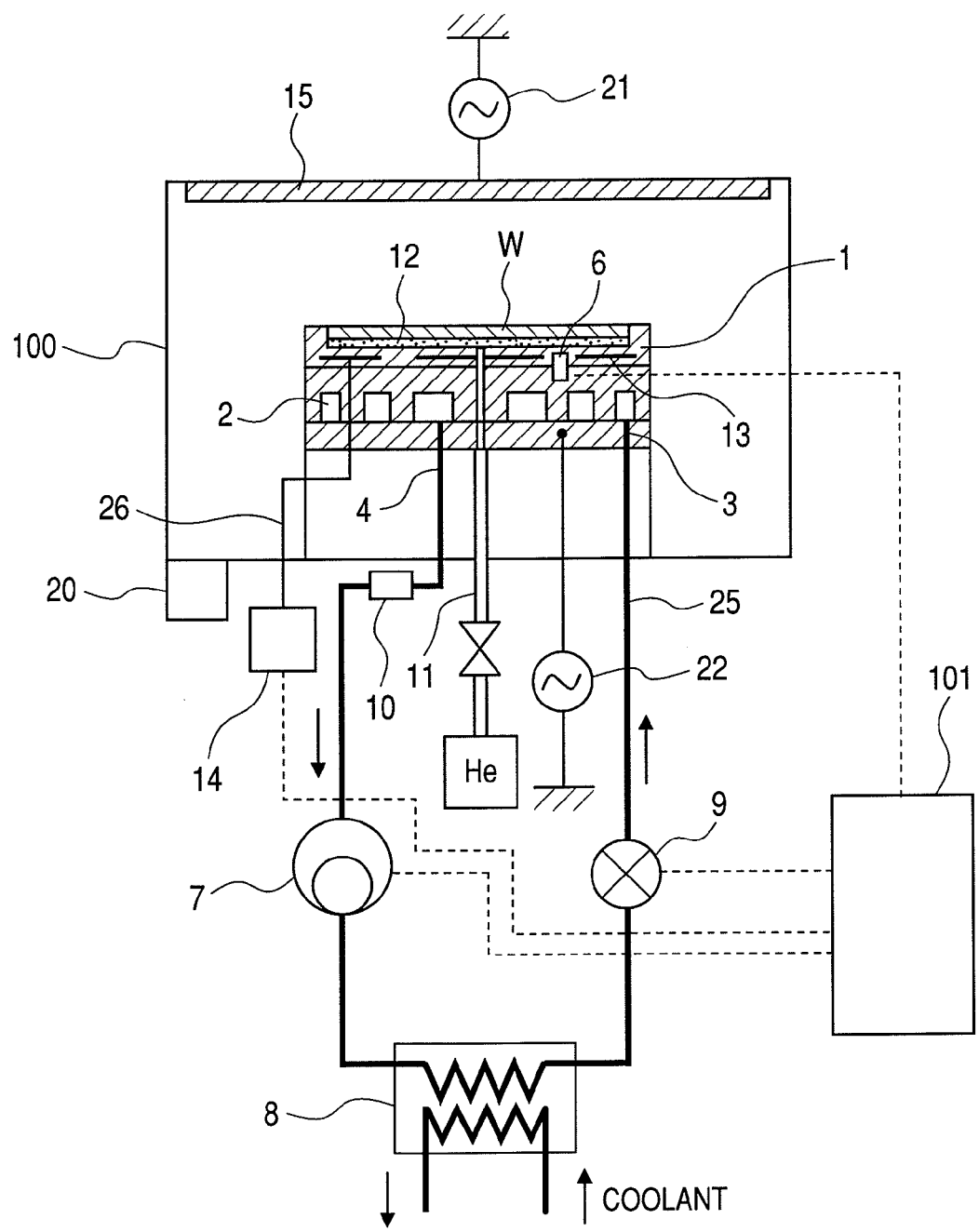
FIG. 10 is an explanatory drawing showing an eighth embodiment of a plasma processing apparatus of the present invention.

FIG. 10 shows an overall system configuration of a plasma processing apparatus according to another embodiment of the present invention. The plasma processing apparatus of this embodiment is provided with a heater layer 13 in a dielectric film of the sample stand 1, in addition to the configuration of the embodiment of FIG. 1. The heater layer 13 is separated into two regions; for example, a central part of the disc-shaped sample stand 1, and a ring-shaped outer circumference part.

Wafer temperatures change depending on processing conditions such as plasma etching, that is, heat inputted to wafer W from plasma, output of each heater region, an a cooling state by a refrigerant within the refrigerant passage 2. Temperature sensors are provided in two regions of the heater layer 13, respectively, and electric power supplied to each heater region from the heat power supply 14 is controlled in the temperature control system 101 along with the flow rate of a refrigerant flowing through the passage 2 of a refrigerating cycle.

The following briefs the operation of the apparatus of FIG. 10. The wafer W is conveyed to the processing chamber 100, and mounted and fixed on the sample stand 1. Then, a process gas is supplied and the processing chamber 100 is adjusted to specific processing pressure. Next, plasma is generated by the supply of electric power of the antenna power supply 21 and the bias power supply 22, and the operation of magnetic field forming means not shown, and etching processing is performed using the plasma. Wafer temperatures during the process are feedback-controlled in the temperature control system 101 while monitoring temperature information from the temperature sensor 6, and the wafer temperatures are controlled by adjusting the flow rate of the refrigerant, evaporation temperature, and the quantity of heating of each region of the heater layer 13 by adjusting the compressor 7, the expansion valve 9, and the heater power supply 14.

Since the refrigerant passage 2 within the sample stand 1 is constructed to change in sectional area according to a change in the heat transfer rate α and pressure loss ΔP of the refrigerant, the in-plane distribution of cooling capacity due to a phase change of the refrigerant is reduced, and in-plane temperatures of the sample can be uniformly and rapidly controlled.

By adopting the construction and control method, highly accurate working is enabled in the whole plane of wafer W even in the condition of etching by a large quantity of input heat by application of high wafer bias electric power.

The etching is completed through such a process, and the supply of electric power, magnetic field, and process gas is halted.

It goes without saying that the present invention is effective for a plasma processing apparatus comprising any one of following system as a plasma generating means.

A system that applies high frequency electric power different from one applied to the wafer W to an electrode disposed on an opposing surface of the wafer W, an induction coupling system, a system of interaction between magnetic field and high frequency electric power, or a system that applies high frequency electric power to the sample stand 1.

The present invention meets working conditions that causes a large quantity of input heat such as application of a high frequency electric power of 3 W/cm$^2$ or more to the wafer W, and is effective also when deep boring of high aspect of an aspect ratio of 15 or more is performed. As a thin film subjected to plasma processing, a single film containing one of SiO$_2$, SiO$_3$N$_4$, SiOCH, and SiC as a principal component, or a multilayer film consisting of film types of two types or more are considered.

Ninth Embodiment

Figure 11:
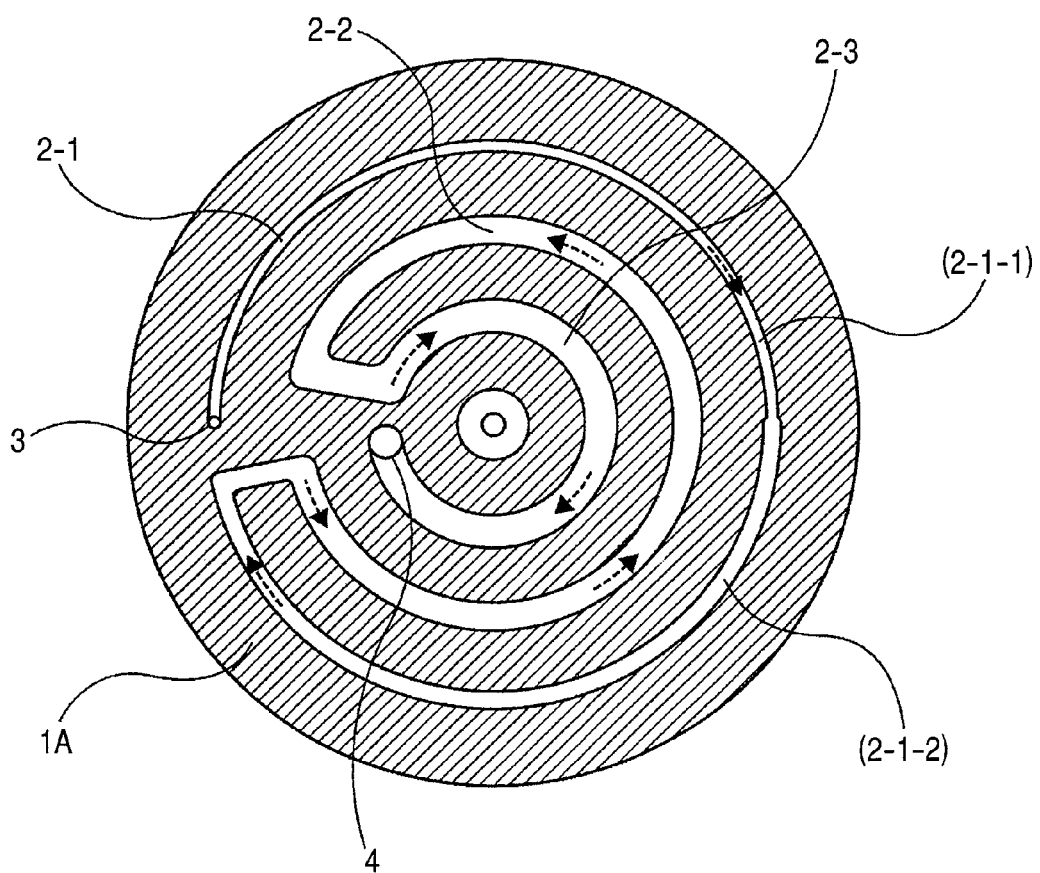
FIG. 11 is a schematic diagram showing a ninth embodiment of a passage structure within a sample stand of the present invention.

FIG. 11, as another embodiment of the refrigerant passage 2, shows an example of enlarging the sectional areas of the respective regions of an outer circumference part, middle part, and inner circumference part of one continuous refrigerant passage. The refrigerant passage 2 includes a first passage 2-1 (2-1-1, 2-1-2) which is connected to the refrigerant supply port 3 and the sectional areas of which are enlarged in two stages, a second passage 2-2 having a larger sectional area than the first passage, and a third passage 2-3 having a larger sectional area than the second passage, and the third passage 2-3 is connected to the refrigerant ejection port 4. Forming the refrigerant passage 2 as one continuous passage prevents equal branch of a refrigerant in a branch part of the refrigerant and contributes to reduction in the risk of causing a temperature difference within a plane. Since a refrigerating cycle of direct expansion system uses evaporation latent heat, cooling capacity per unit flow rate is high, and the flow rate of the refrigerant is lower compared with conventional liquid refrigerant systems. Therefore, when a branch part is provided within the refrigerant passage 2, the number of branches should be restrained to about two to four for one passage. For more branches, it is desirable to dispose a distributor for refrigerant.

Tenth Embodiment

Figure 12:
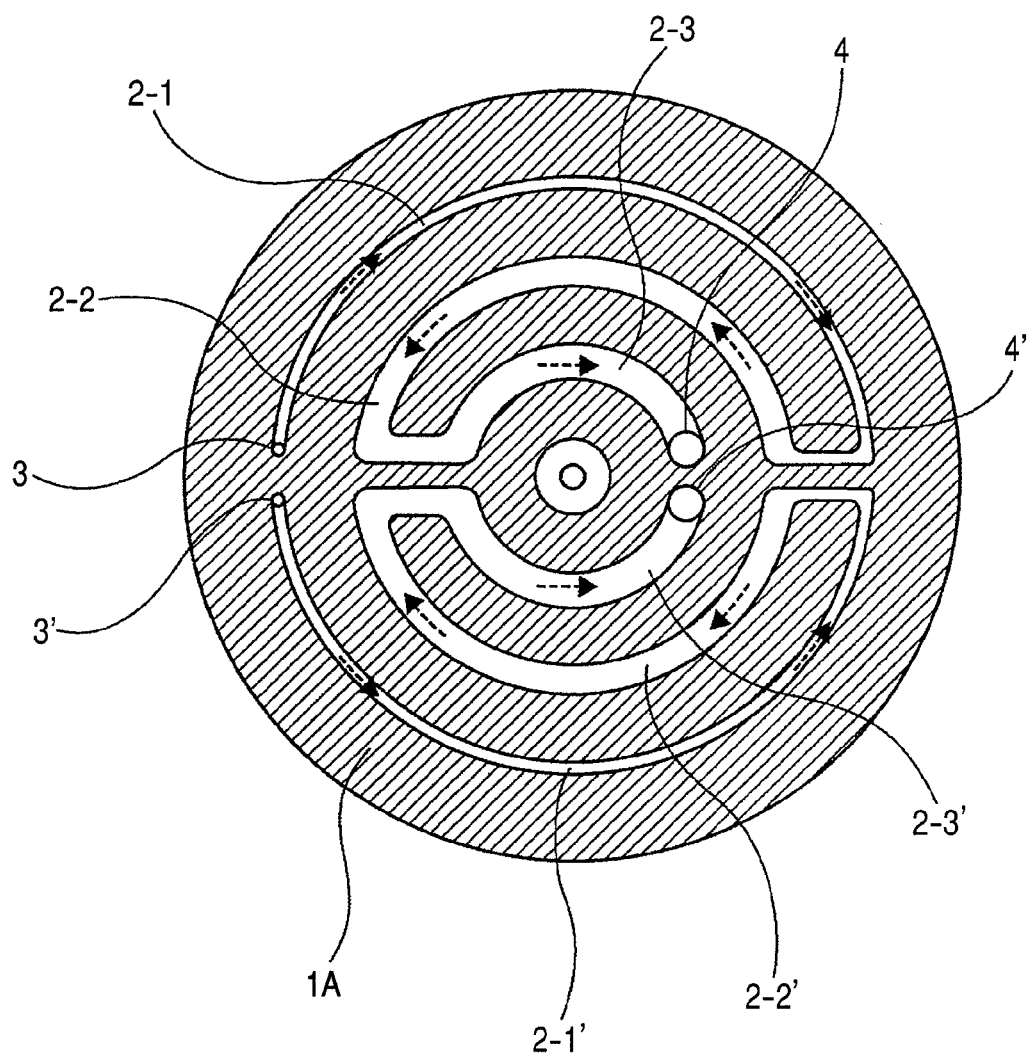
FIG. 12 is a schematic diagram showing a tenth embodiment of a passage structure within a sample stand of the present invention.

FIG. 12, as another embodiment of the refrigerant passage 2 constituting an evaporator, an example that comprising two independent refrigerant passages 2 disposed in two region of the electrode, each of the refrigerant passages is one continuous passage, the sectional area of each region within the passage enlarges, and the passage is disposed multidimensionally (vertically separated in a plan view) in a circumferential direction. In this embodiment, each of the multidimensional (disposed) refrigerant passages 2 constitute independent evaporators of direct expansion refrigerating cycles (or direct expansion system heat cycles), respectively. The construction and operation of these direct expansion refrigerating cycles are the same as those in the first embodiment, for example.

The two independent refrigerant passages 2 includes first passages 2-1 and 2-1' connected to two refrigerant supply ports 3 and 3' located apart in a circumferential direction, second passages 2-2 and 2-2' having larger sectional areas, and third passages 2-3 and 2-3' having further larger sectional areas, and the two third passages are connected to two refrigerant ejection ports 4 and 4' located apart in a circumferential direction.

Since each of the separated two refrigerant passages has an independent structure within a plane, by individually controlling refrigerant pressure (refrigerant evaporation temperature) in regions of the refrigerant passage, the in-plane temperature distribution of wafer on the sample stand 1 can be arbitrarily controlled.

Although the example of FIG. 12 shows separated two refrigerant passages 2, the independent refrigerant passages may be made further multidimensional in a circumferential direction; for example, a plane corresponding to a sample mounting surface of the sample stand 1 is split into three or four equal parts so that the sectional area of one continuous refrigerant passage is changed midway within each of the split planes as in the embodiments described previously. By this construction, the in-plane temperature distribution of wafer can be controlled more exactly.

Eleventh Embodiment

Figure 13:
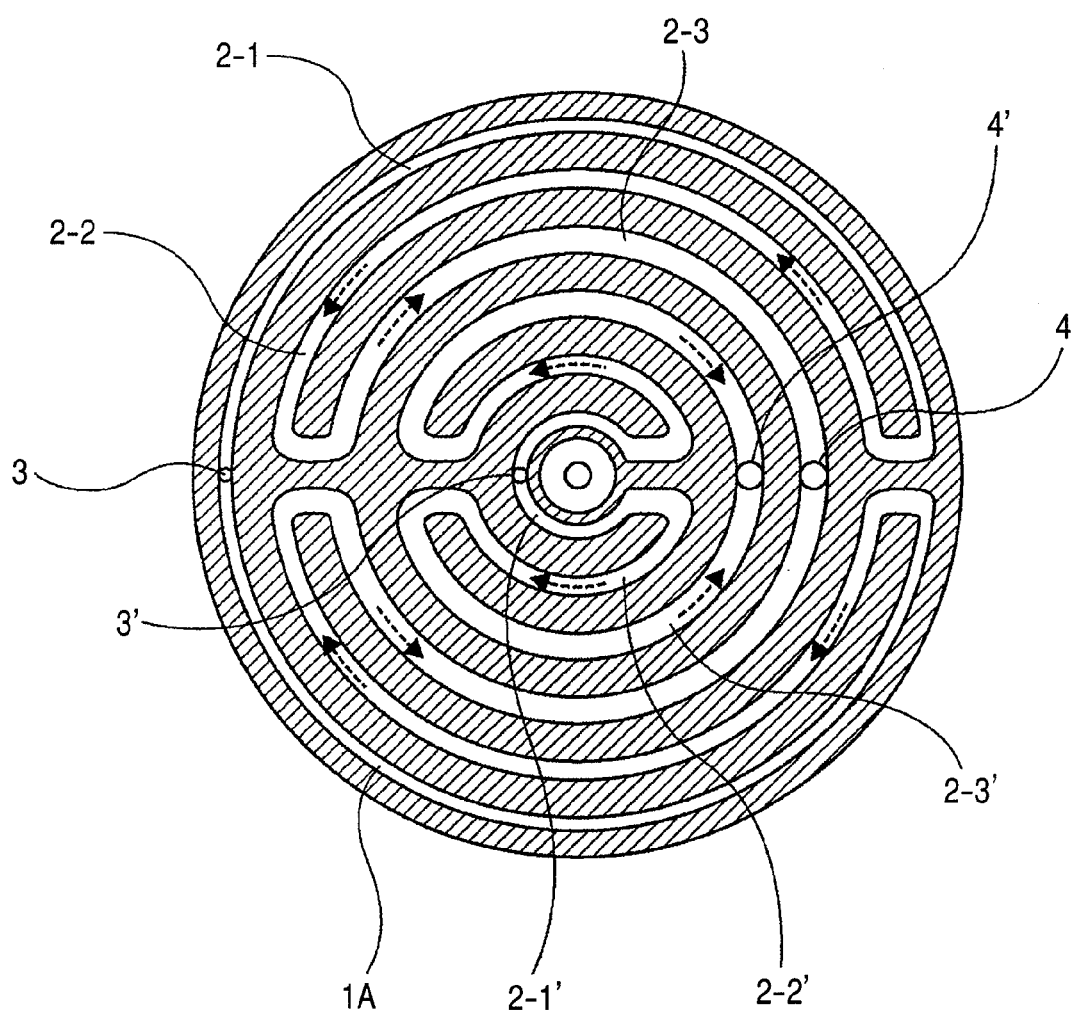
FIG. 13 is a schematic diagram showing an eleventh embodiment of a passage structure within a sample stand of the present invention.

The present invention may be constructed to make the refrigerant passage 2 multidimensional in a radial direction (inside and outside in a plan view). Specifically, as shown in FIG. 13, independent two refrigerant passages include first passages 2-1 and 2-1' connected to two refrigerant supply ports 3 and 3' in different positions in a radial direction, second passages 2-2 and 2-2' having larger sectional areas, and third passages 2-3 and 2-3' having further larger sectional areas, and the two third passages are connected to two refrigerant ejection ports 4 and 4' in different positions in a radial direction. In this embodiment, the multidimensional (disposed) separated refrigerant passages 2 respectively constitute independent evaporators of direct expansion system refrigerating cycles.

Since each of the two independent refrigerant passages has an independent structure within a plane, by individually controlling refrigerant pressure (refrigerant evaporation temperature) in regions of the refrigerant passage, the in-plane temperature distribution of wafer on the sample stand 1 can be arbitrarily controlled. Also in this case, splitting the plane into three or four equal parts enables more exact control.

What is claimed is:

1. A plasma processing apparatus comprising a vacuum processing chamber; a sample stand having an electrode with electrostatic chuck within the vacuum processing chamber; a plasma generating means for generating plasma of a processing gas introduced into the vacuum processing chamber and processing the surface of a sample to be processed mounted on the electrode with electrostatic chuck by the plasma; and a refrigerating cycle including a compressor, a condenser, and an expansion valve which disposed outside the vacuum processing chamber, respectively, wherein the refrigerating cycle further includes a refrigerant passage provided in a lower portion of the electrode with electrostatic chuck of the sample stand as a first evaporator, wherein the refrigerant passage has a supply port and an ejection port provided in the sample stand, and the passage sectional areas of the refrigerant passage increase successively from the supply port to the ejection port, wherein the refrigerating cycle further includes a refrigerant evaporator functioning as a second evaporator that is disposed between the ejection port and the compressor and outside the vacuum processing chamber, and control means for controlling a refrigerant supplied to and ejected from the refrigerant passage, wherein the control means controls the flow rate of the refrigerant to prevent dryout from occurring in the first evaporator due to heat inputted from the sample to be processed, wherein the refrigerant evaporator has a function to vaporize a refrigerant not evaporating within the refrigerant passage, and wherein the inside wall of the refrigerant passage has projections and depressions formed, and the height of the of the projections and depressions decreases successively between the supply port and the ejection port of the refrigerant.

2. The plasma processing apparatus according to claim 1, wherein the refrigerant passage provided in the sample stand is provided within an identical plane, and includes a plurality of regions different in passage sectional area, and wherein the passage sectional areas of the plurality of regions increase successively from the supply port to the ejection port of the refrigerant.

3. The plasma processing apparatus according to claim 2, wherein the refrigerant passage of the each region provided in the sample stand is a ring-shaped passage.

4. The plasma processing apparatus according to claim 2, wherein the refrigerant passage of the each region provided in the sample stand is one continuous passage.

5. The plasma processing apparatus according to claim 1, wherein the refrigerant passage provided in the sample stand has branched passage sectional areas of the refrigerant passage that are placed in both right and left directions in a plural stages within an identical plane, and each of the branched passage sectional areas constitutes an evaporator of each independent refrigerating cycle.

6. A plasma processing apparatus comprising a vacuum processing chamber; a sample stand having a sample mounting plane within a vacuum processing chamber; a plasma generating means for generating plasma of a processing gas introduced into the vacuum processing chamber and processing the surface of a sample to be processed mounted on the electrode with electrostatic chuck by the plasma; and a refrigerating cycle including a compressor, a condenser, and an expansion valve which disposed outside the vacuum processing chamber, respectively, wherein the refrigerating cycle further includes a refrigerant passage provided in a lower portion of the electrode with electrostatic chuck of the sample stand as a first evaporator, and the refrigerating cycle further including a compressor, a condenser, and an expansion valve each of which disposed outside the vacuum processing chamber, wherein the refrigerant passage has a supply port and an ejection port provided in the sample stand, and the passage sectional areas of the refrigerant passage increase successively from the supply port to the ejection port, and is constructed to restrict changes in the heat transfer rate of the refrigerant in each region of the refrigerant passage so as to be almost uniform, regardless of dryness degrees of the refrigerant, wherein the inside wall of the refrigerant passage has projections and depressions formed, and the height of the projections and depressions decreases successively between the supply port and the ejection port of the refrigerant, and wherein the refrigerating cycle further includes a refrigerant evaporator functioning as a second evaporator that is disposed between the ejection port and the compressor and outside the vacuum processing chamber, and the refrigerant evaporator has a function to vaporize a refrigerant not evaporating within the refrigerant passage within the sample stand.

7. The plasma processing apparatus according to claim 6, wherein the refrigerant passage provided in the sample stand is provided within an identical plane, and includes a plurality of regions different in passage sectional area, and wherein the passage sectional areas of the plurality of regions increase successively from the supply port to the ejection port.

8. A plasma processing method generating plasma of a processing gas introduced into a vacuum processing chamber by a plasma processing apparatus and processing the surface of a sample to be processed mounted on an electrode with electrostatic chuck of a sample stand within the vacuum processing apparatus by the plasma, wherein, the plasma processing apparatus has a refrigerating cycle including a compressor, a condenser, and an expansion valve which disposed outside the vacuum processing chamber, respectively, and a refrigerant passage provided in a lower portion of the electrode with electrostatic chuck of the sample stand as a first evaporator, wherein the refrigerant passage has a supply port and an ejection port provided in the sample stand, and the passage sectional areas of the refrigerant passage increase successively from the supply port to the ejection port, wherein the inside wall of the refrigerant passage has projections and depressions formed, and the height of the projections and depressions decreases successively between the supply port and the ejection port of the refrigerant, wherein the refrigerating cycle further includes a refrigerant evaporator functioning as a second evaporator that is disposed between the ejection port and the compressor and outside the vacuum processing chamber, and control means for controlling a refrigerant supplied to and ejected from the refrigerant passage, and wherein the plasma processing method comprises the steps of:

processing the surface of the sample to be processed mounted on the electrode with electrostatic chuck of the sample stand by the plasma while circulating the refrigerant through the refrigerant passage of the sample stand within the vacuum processing chamber;

controlling the temperature of the electrode with electrostatic chuck plane by adjusting the flow rate of the refrigerant to prevent dryout from occurring in the refrigerant passage due to heat inputted from the sample to be processed; and vaporizing the refrigerant not evaporating within the refrigerant passage by the refrigerant evaporator.

9. The plasma processing method according to claim 8, wherein the refrigerant passage provided in the sample stand is constructed to restrict changes in the heat transfer rate of the refrigerant in each region of the refrigerant passage so as to be almost uniform, regardless of dryness degrees of the refrigerant, and wherein the plasma processing method further comprises the step of monitoring the temperature of the sample to be processed, and pressure and temperature in the vicinity of the exit of the refrigerant passage, and controlling temperature within the electrode with electrostatic chuck plane while adjusting the flow rate of the refrigerant so as to prevent the refrigerant from completely vaporing.

\* \* \* \* \*